United States Patent
Mikaelian

(10) Patent No.: US 12,169,329 B2
(45) Date of Patent: Dec. 17, 2024

(54) SPECIALTY CONTACT LENS DESIGN AND MANUFACTURING

(71) Applicant: Hedgefog Research, Inc., San Pedro, CA (US)

(72) Inventor: Gareguin Mikaelian, San Pedro, CA (US)

(73) Assignee: Hedgefog Research, Inc., San Pedro (CA)

( * ) Notice: Subject to any disclaimer, the term of this patent is extended or adjusted under 35 U.S.C. 154(b) by 491 days.

(21) Appl. No.: 17/098,056

(22) Filed: Nov. 13, 2020

(65) Prior Publication Data

US 2021/0149218 A1  May 20, 2021

Related U.S. Application Data

(60) Provisional application No. 62/935,348, filed on Nov. 14, 2019.

(51) Int. Cl.
  *G02C 7/04* (2006.01)
  *G02C 7/02* (2006.01)

(52) U.S. Cl.
  CPC .............. *G02C 7/047* (2013.01); *G02C 7/027* (2013.01); *G02C 7/028* (2013.01)

(58) Field of Classification Search
  CPC ........ G02C 7/047; G02C 7/027; G02C 7/028; G06F 30/10; G06F 30/20
  See application file for complete search history.

(56) References Cited

U.S. PATENT DOCUMENTS

| | | | |
|---|---|---|---|
| 2,237,744 A | 4/1941 | Mullen | |
| 2,241,415 A | 5/1941 | Moulton | |
| 2,664,025 A | 12/1953 | Herman | |
| 3,246,941 A | 4/1966 | Moss | |
| 5,114,628 A | 5/1992 | Hofer et al. | |
| 5,963,300 A | * 10/1999 | Horwitz | A61B 3/1015 |
| | | | 351/212 |
| 6,241,355 B1 | 6/2001 | Barsky | |

(Continued)

OTHER PUBLICATIONS

Chu, L. & Barsky, B. "Cylindrical Coordinate Representations for Modeling Surfaces of the Cornea and Contact Lenses" IEEE Int'l Conf. Shape Modeling & Applications (1999) available from <https://ieeexplore.ieee.org/document/749329> (Year: 1999).*

(Continued)

*Primary Examiner* — Jay Hann
(74) *Attorney, Agent, or Firm* — Chang & Hale LLP

(57) ABSTRACT

Specialty contact lenses can be designed using approximations of one or both surfaces using mathematical representations. The approximations can be configured to optimize the lens manufacturing process. Constraints can be applied to the approximation to achieve the targeted results. The constraints can be assigned based at least in part on labels applied to measurements of the eye. Lens fit parameters can also be applied to control the degree to which the approximation approaches perfectly matching a targeted shape (e.g., the topography of the patient's eye). For example, the lens fit parameter can be related to the order of the mathematical representation used in the approximation. The contact lenses designed and manufactured using the methods and systems disclosed herein can be of any suitable type including, but not limited to, scleral lenses.

20 Claims, 7 Drawing Sheets

(56) References Cited

U.S. PATENT DOCUMENTS

| | | | | |
|---|---|---|---|---|
| 6,340,229 | B1* | 1/2002 | Lieberman | G02C 7/04 351/159.02 |
| 6,808,262 | B2* | 10/2004 | Chapoy | G02C 7/048 351/159.47 |
| 7,040,755 | B2* | 5/2006 | Legerton | G02C 7/047 351/159.1 |
| 7,111,938 | B2* | 9/2006 | Andino | G02C 7/047 351/212 |
| 7,270,412 | B2 | 9/2007 | Legerton et al. | |
| 7,862,176 | B2* | 1/2011 | Gemoules | G02C 7/047 351/212 |
| 8,388,130 | B2* | 3/2013 | Legerton | G02C 7/044 351/159.23 |
| 8,545,023 | B2* | 10/2013 | Holladay | A61B 3/1005 351/208 |
| 9,551,885 | B2 | 1/2017 | Sindt et al. | |
| 9,925,038 | B2* | 3/2018 | Yoon | G02C 7/027 |
| 10,054,802 | B2 | 8/2018 | Bishop et al. | |
| 10,379,381 | B2* | 8/2019 | Gerligand | G02C 7/047 |
| 10,473,951 | B2* | 11/2019 | Yu | A61B 3/0025 |
| 10,591,748 | B2 | 3/2020 | Sindt et al. | |
| 10,598,955 | B2* | 3/2020 | Creighton | G02C 7/024 |
| 10,620,455 | B2* | 4/2020 | Tuan | H04N 13/344 |
| 2010/0123875 | A1 | 5/2010 | Gemoules et al. | |
| 2019/0155052 | A1 | 5/2019 | Sindt et al. | |
| 2019/0155053 | A1 | 5/2019 | Sindt et al. | |
| 2020/0041817 | A1 | 2/2020 | Sanders et al. | |
| 2021/0030531 | A1* | 2/2021 | Ambati | A61F 2/1637 |

OTHER PUBLICATIONS

Gregory Denayer, et al., "Qualitative Assessment of Scleral Shape Patterns Using a New Wide Field Ocular Surface Elevation Topographer: The SSSG Study," J Cont Lens Res Sci vol. 1(1):12-22; Nov. 16, 2017, in 11 pages.

Gregory Denayer, et al., "Correlation of Corneal and Scleral Topography in Cases with Ecstasias and Normal Corneas: The SSSG Study," J Cont Lens Res Sci vol. 3(1):e10-e20; May 9, 2019, in 11 pages.

* cited by examiner

SPECIALTY CONTACT LENS DESIGN AND MANUFACTURING

CROSS-REFERENCE TO RELATED APPLICATIONS

This application claims priority to U.S. Prov. App. No. 62/935,348 filed Nov. 14, 2019 and entitled "SYSTEMS AND METHODS FOR SPECIALTY CONTACT LENS DESIGN AND MANUFACTURING," which is expressly incorporated by reference herein in its entirety for all purposes.

BACKGROUND

Field

The present disclosure relates to the field of design, manufacturing, and fitting of specialty contact lenses.

Description of Related Art

Specialty contact lenses are often designed and manufactured specifically for a particular patient, thus allowing for variation of a number of lens parameters to optimize the fit and performance. In the early 20th century, contact lenses were manufactured using molding techniques and many of them were designed to precisely fit the patient's sclera and to vault over the cornea. For instance, as early as 1938 Feinbloom discloses "a method of manufacturing a contact lens which includes the steps of placing a sterilized, non-irritating plastic which is soft at 102° Fahrenheit on the eyeball at a temperature not appreciably greater than 102° Fahrenheit so as to cover the cornea and the white of the eye for a portion under the eyelids, permitting said plastic to harden and removing same when hardened, obtaining a positive from said hardened plastic, and making from said positive a rim of a synthetic resin for said contact lens, whereby said rim conforms with the shape of the white of said eyeball" (U.S. Pat. No. 2,129,304). Later, in U.S. Pat. No. 2,241,415 Moulton discloses a contact lens with the inner surface shaped to fit the general contour shape of the scleral portion of the eye. In a 1948 patent (U.S. Pat. No. 2,438,743), Feinbloom discloses "a contact lens, adapted to be fitted directly on an eyeball, comprising a corneal lens section, a conical scleral bearing section and a scleral flange all formed as an integral plastic unit free of discontinuities on the inner surfaces thereof said contact lens having substantially its entire area peripheral to its corneal section of conical configuration". He furthermore specifies a necessity for identifying and designing a limbus clearance zone, thus providing a blueprint for a modern scleral lens design, which became popular roughly 50 years later.

As early mass production capabilities emerged, the contact lens industry moved away from custom lens manufacturing to mass-produced contact lenses with pre-defined shapes and sizes. In the last decade of the 20th century, with the advent of new gas permeable materials and computerized manufacturing techniques, scleral contact lenses experienced a renaissance and a renewed acceptance by eyecare practitioners. And with the availability of instruments capable of visualizing and mapping the anterior surface of the eye, customized contact lenses that are designed to conform to a specific eye shape were rediscovered and are now reemerging as one of the preferred modalities for treating refractive errors and ocular surface disease.

SUMMARY

According to a number of implementations, the present disclosure relates to manufacturing a specialty contact lens. The manufacturing process includes one or more of the following steps: (1) performing one or more measurements of the eye; (2) approximating one or more parameters of the eye that can include assumptions about eye shape, eye anatomy, eye physiology, eye pathology, eye biomechanics, and/or eye optics; (3) generating a lens shape, the lens shape based on the measurements of the eye and/or the approximations of the one or more parameters of the eye; (4) manufacturing the lens based on the generated lens shape; and/or (5) fitting the manufactured lens on the eye and adjusting the lens design. The present disclosure also relates to specialty contact lenses manufactured using the disclosed manufacturing processes. The present disclosure also relates to systems configured to implement the disclosed manufacturing processes.

The present disclosure also relates to a method for generating a contact lens design. The method includes acquiring data points representing a surface of an eye. The method also includes labeling one or more of the acquired points with one or more labels. The method also includes identifying a set of constraints that relate a back surface and/or a front surface of the contact lens to the labeled points. The method also includes generating the back surface and/or the front surface of the contact lens based on a set of lens parameters and the set of constraints.

In some embodiments, the present disclosure provides for a method of manufacturing a contact lens that implements the method for generating the contact lens design above. The method further includes manufacturing the lens based on the generated back surface and/or front surface. The method also includes identifying modifications to improve a fit of the contact lens to the eye. The method also includes modifying the contact lens design by adjusting the set of constraints or by relabeling one or more of the acquired points.

In some embodiments, the present disclosure provides for a report that illustrates a simulated fit of a designed contact lens to an eye. The report can include a visual representation of oxygen transmission to a surface of the eye. The report can include a numerical calculation of the oxygen transmission to various portions of the surface of the eye. The report can include a numerical calculation of an average of the oxygen transmission to the surface of the eye. The report can include a numerical calculation of maxima and minima of the oxygen transmission to various portions of the surface of the eye.

According to a first aspect, the present disclosure relates to a method of generating a manufacturing instruction file for the manufacture of a specialty contact lens. The method includes acquiring three-dimensional points representing a surface of an eye. The method includes automatically assigning labels to some or all of the acquired the three-dimensional points. The method includes applying constraints to the acquired three-dimensional points, the constraints associated with the assigned labels. The method includes automatically generating a mathematical representation of a surface of the specialty contact lens, the mathematical representation conforming to the applied constraints.

In some embodiments of the first aspect, the mathematical representation comprises a series of orthogonal functions. In further embodiments, the orthogonal functions comprise spherical harmonics. In further embodiments, the method further includes receiving a customization factor. In yet further embodiments, generating the mathematical representation is limited by the customization factor. In further embodiments, an order of the series of orthogonal functions is limited by the customization factor.

In some embodiments of the first aspect, the method further includes acquiring an image of the surface of the eye. In further embodiments, labelling the acquired points is based at least in part on cross-referencing the acquired image of the surface of the eye with corresponding points of the acquired three-dimensional points.

In some embodiments of the first aspect, the three-dimensional points are acquired using one or more of the following methods: Placido topography, Scheimpflug imaging, optical coherence tomography, impression, structured light scanning, profilometry, or slit light scanning. In some embodiments of the first aspect, the method further includes partitioning one or both surfaces of the specialty contact lens into a plurality of sections with each section having a specific mathematical representation. In some embodiments of the first aspect, the constraints are defined in terms of distances between labeled parts of the eye and sections of the one or both lens surfaces. In some embodiments of the first aspect, the contact lens is a scleral contact lens.

In some embodiments of the first aspect, the constraints are defined based on optimizing the vision of the person wearing the lens either during lens wear or after the lens removal. In further embodiments, phoria measurements of one or both eyes are used to determine the alignment and shape of the at least portion of the front surface of the lens.

In some embodiments of the first aspect, a subset of the three-dimensional points represents a measurement of the surface of the eye, and another subset represents an interpolation or extrapolation of the three-dimensional points. In some embodiments of the first aspect, a subset of the three-dimensional points represents a measurement of the surface of the eye, and another subset represents a mathematical modeling of a shape of the eye based on biomechanical properties of the eye.

In some embodiments of the first aspect, the method further includes manufacturing a lens based on the mathematical representation of the surface of the contact lens. In further embodiments, the method further includes modifying the lens by adjusting the applied constraints or assigning new labels to some or all of the acquired three-dimensional points. In yet further embodiments, modifications to the lens include adding one or more three-dimensional points to the acquired three-dimensional points and assigning labels and constraints to the newly added three-dimensional points.

According to a second aspect, the present disclosure relates to a contact lens design system. The system includes a data store configured to store executable instructions. The system includes a processor coupled to the data store, the processor configured to, upon executing the stored executable instructions acquire three-dimensional points representing a surface of an eye; automatically assign labels to some or all of the acquired the three-dimensional points; apply constraints to the acquired three-dimensional points, the constraints associated with the assigned labels; and automatically generate a mathematical representation of a surface of the specialty contact lens, the mathematical representation conforming to the applied constraints.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
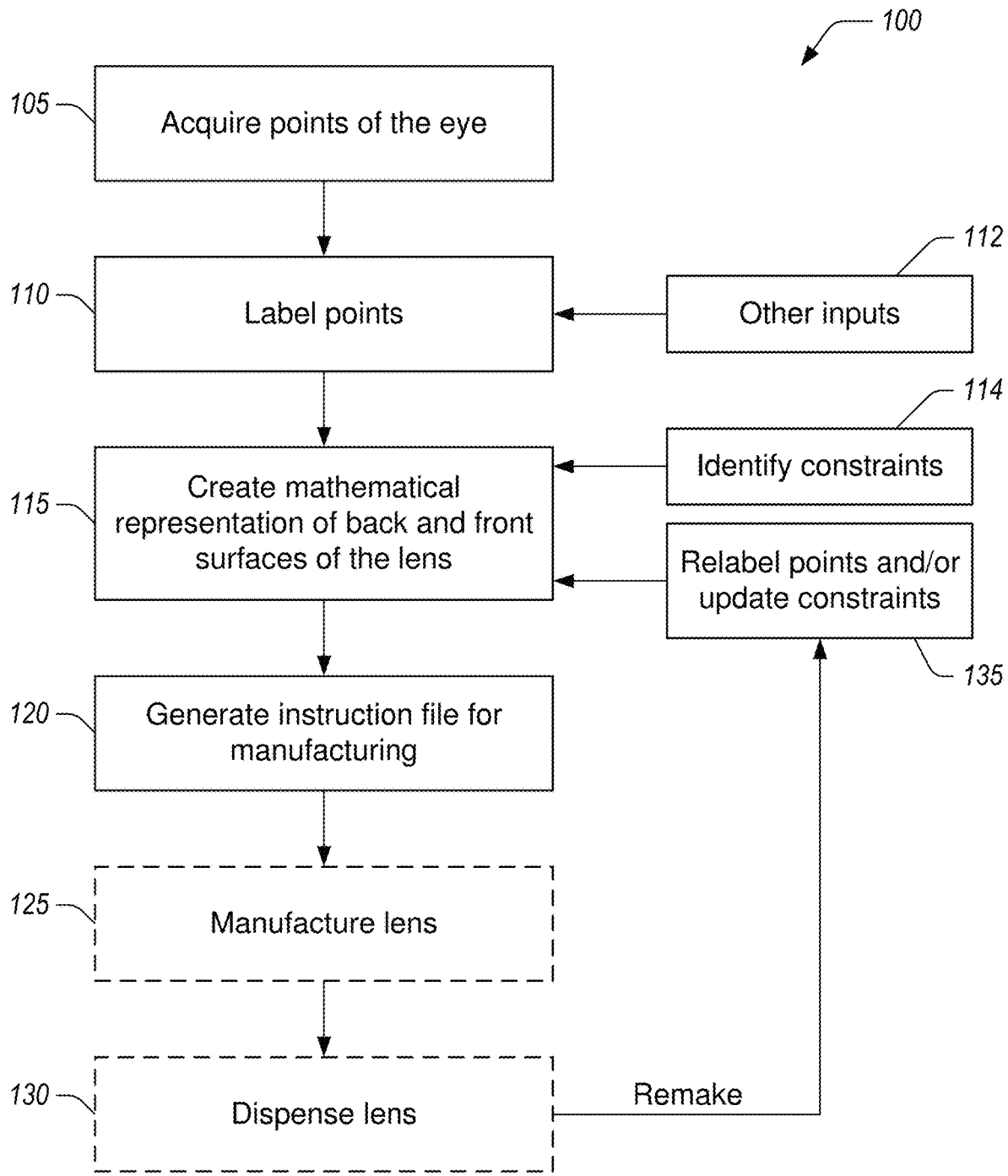
FIG. 1 illustrates a flow chart of an example contact lens design and manufacturing process.

The headings provided herein, if any, are for convenience only and do not necessarily affect the scope or meaning of the claimed invention.

Overview

In general, a contact lens type can be optimized for a specific patient and can be manufactured using specialty contact lens manufacturing technologies. A contact lens is usually comprised of two surfaces. It is conventional to denote the surface of the contact lens closest to the eye as the back surface, and the surface in contact with the air as the front surface. The variety of lens types may include, but not be limited to, soft contact lenses; corneal gas permeable (GP) lenses; rigid gas permeable (RGP) lenses; orthokeratology (ortho-K) lenses; scleral lenses, including ocular prosthetics and ocular shells; mini scleral lenses; and hybrid lenses combining GP optic zones and soft haptic surfaces.

Specialty contact lenses can be fit to a specific patient. The fitting can be based on eye measurements using a variety of techniques which can include, but are not limited to, corneal topography, optical power of various parts of the eye, visual axis orientation, and others. Contact lens fitting can also be accomplished using trial lens sets and a trial and error procedure. The measurements and trial lens fitting results can then be communicated to the contact lens manufacturer and a lens may be optimized and manufactured to fit the eye of a specific contact lens wearer. In certain instances, a contact lens can be designed by generating a point cloud that matches fully or partially the measured points on the eye. Modifications can then be accomplished on a point-by-point basis. However, this can be a time-consuming process, the resulting manufacturing files can become undesirably complex, and/or the manufacturing of the lens on a lathe or other device can require an undesirable amount of time.

Accordingly, disclosed herein are systems and methods for designing specialty contact lenses that approximate one or both surfaces of the contact lens using mathematical representations. The approximations can be configured to enhance, improve, or optimize the lens manufacturing process. Constraints can be identified and applied to the approximation to achieve the targeted results. The constraints can be assigned based at least in part on labels applied to measurements of the eye. Lens fit parameters can also be applied to control the degree to which the approximation approaches perfectly matching a targeted shape (e.g., the topography of the patient's eye). For example, the lens fit parameter can be related to the order of the mathematical representation used in the approximation. The contact lenses designed and manufactured using the methods and systems disclosed herein can be of any suitable type including, but not limited to, scleral lenses and ortho-K lenses or devices.

Advantageously, the disclosed systems and methods can facilitate designing and modifying specialty contact lenses. In addition, the approximations can reduce manufacturing file complexity. Furthermore, using approximations can result in specialty contact lens surfaces that are easier to manufacture (e.g., requiring less time to manufacture) while providing targeted performance and fit for a patient.

Example Lens Design Processes

FIG. 1 illustrates a flow chart of an example method 100 for designing and manufacturing a specialty contact lens. The method 100 is described as being performed by a contact lens design system, such as the system described herein with reference to FIG. 7. However, it is to be understood that any suitable system or device can be used to perform the method 100 or any suitable component or combination of components of such a system can be used to perform a portion of any step of the method 100 or one or more steps of the method 100. In addition, one or more systems can work together to perform the method 100.

The method 100 can be used to generate a design for a specialty contact lens that approximates a targeted surface topography of one or both surfaces of the contact lens. As described herein, the approximation can be accomplished using mathematical representations and/or numerical approximations based on mathematical representations. The method 100 utilizes a measured surface topography of the targeted eye for the purposes of, for example and without limitation, lens selection, lens design, lens fitting, lens optimization, and production. The method 100 can be used to produce contact lenses that provide comfort, improve visual performance, or both.

In block 105, the contact lens design system acquires a set of three-dimensional points describing the topography of a targeted eye (e.g., the eye of a patient). In block 110, the contact lens design system labels some or all of the acquired points. In doing so, the contact lens design system can use other inputs in block 112, where other inputs include, for example and without limitation, user input, labelling software, images of the targeted eye, optical measurements of the eye such as objective and subjective refraction, aberrometry, optical path difference, raytracing, anterior and posterior corneal power, lenticular power, gaze direction, angle kappa, angle alpha, pupil size, visual axis orientation and location, fixation point, or the like. Labelling in block 110 can be accomplished based at least in part on the anatomy of the eye, physiology of the eye, and/or other aspects of the eye. In block 114, the contact lens design system identifies and applies a set of constraints to some or all of the labeled points. In block 115, the contact lens design system generates one or both surfaces of the contact lens based at least in part on the plurality of points and the applied constraints. The one or both surfaces can be generated using a mathematical representation. The mathematical representation can be used to approximate the topography of the eye, a targeted surface shape, or a combination of both. In some implementations, it may be beneficial to generate a first surface of the lens (or a portion thereof) and constrain the second surface (or a portion thereof) to the first surface (or its portion). In block 120, once the front and back surfaces of the contact lens are defined, the contact lens design system generates a manufacturing or instruction file comprising a set of instructions for the lens manufacturing device.

In block 125, the contact lens design system can manufacture the contact lens or the contact lens can be manufactured by a separate manufacturing system. In block 130, the contact lens can be dispensed for evaluation. The evaluation can be performed by a practitioner, the contact lens design system, or another system.

If a change is requested or required as a result of the evaluation, the contact lens can be remade or updated. In block 135, the contact lens design system can update the constraints and/or relabel one, some, or all of the acquired points. Similarly, in block 135, the contact lens design system can acquire additional three-dimensional points to add to the originally acquired three-dimensional points. The contact lens design system can then update constraints, add new constraints, update labels, and/or add new labels in block 135. In some embodiments, constraints can be updated based on an evaluation of the centration and/or fit of the lens placed on an eye, as described herein. The contact lens design system can then return to block 115 to repeat the method 100 from that point. This process can be iterated a number of times to produce an acceptable specialty contact lens.

As set forth above, the contact lens design system can acquire three-dimensional points describing a targeted eye (e.g., the eye of a patient) in block 105. The three-dimensional points representing the topography of the targeted eye can be represented in a number of coordinate systems, including but not limited to Cartesian, cylindrical, or spherical coordinates. Acquisition of the three-dimensional points can be accomplished by receiving data points from a measurement system and/or by performing the measurements itself. The measurements can be acquired using one or more different measurement techniques. One such measurement is corneal topography, which can be done using a number of instruments and methods that include, but are not limited to, Placido disk or Placido cone topography, Scheimpflug imaging, scanning slit topography, optical coherence tomography (OCT), profilometry, or structured light imaging that may or may not use fluorescence-based imaging. Other methods providing corneal topography measurements may also be utilized. For example, ocular surface topography can be measured by applying a pliable material to the surface of the eye and performing a measurement of the impression of the eye on the pliable material. As another example, the ocular surface topography can be evaluated by placing a lens or another object of a known shape on the eye and measuring and/or imaging clearances and impingement of the ocular surface. This can be accomplished, in certain implementations, by placing a contact lens of a known shape on the eye and filling the vault between the lens and the eye surface with a fluorescent dye. Then, the distance between the eye surface and the back surface of the lens can be evaluated by analyzing the fluorescence intensity of the dye at different locations on the eye.

In some embodiments, it may be advantageous to acquire a number of different measurements with varying gaze direction to improve the design, fit, and/or performance of the contact lens. For a number of patients, a single measurement of the ocular surface may not provide sufficient coverage to evaluate the fit of the entire contact lens, even when eyelids are retracted. In such cases, it may be advantageous to perform several measurements with varying gaze directions and then use several topographic maps to design a lens that fits separate portions of the eye.

Another type of eye measurement that can be used includes acquiring an impression of the eye. Data points can be extracted or determined based on measurements of the impression. A topography of the eye can then be constructed based on the extracted data points.

In some embodiments, topography measurements can be performed using an instrument that has one or more degrees of freedom. This allows the topography measurements to be acquired using a variety of measurement angles. This may be advantageous, for example, when attempting to center the eye to obtain uniform scleral coverage around the limbus.

In some embodiments, a three-dimensional map of the limbus can be generated or acquired. Typical measurement instruments assume that the ocular limbus is in a single plane. However, this assumption may not be suitably accurate. Thus, it may be advantageous to map the limbus in three-dimensional space. This can be accomplished using optical coherence tomography (OCT), Scheimpflug imaging, structured light imaging, or other methods. Having the three-dimensional map of the limbus may be beneficial when attempting to create a lens design that benefits from a certain or targeted distance between the lens and the eye limbus or its portion.

In some embodiments, it may be advantageous to combine measurement techniques to map portions of both the sclera and cornea. A corneal topography measurement can be combined with a scleral topography measurement to obtain a map of at least a portion of the anterior ocular surface. As an example, it may be beneficial to combine a measurement of the cornea obtained using the Scheimpflug imaging technique with a measurement of the sclera generated by mapping an impression of the eye. In such instances, the impression mapping technology may provide better accuracy and coverage on the scleral portion, while the corneal map may provide an ability to identify the limbus of the eye. The combination of the two methods may be able to provide good coverage on the eye with accurately identified limbal points.

In some embodiments, it may be advantageous to acquire a three-dimensional point cloud based on one or more measurement techniques. For example, a three-dimensional point cloud can be generated based on an impression taken of the eye. It may be advantageous to combine this point cloud with another point cloud generated by an eye surface measurement instrument, examples of are described herein. By way of example, portions of the eye topography may be acquired using a Placido disk instrument or another measurement device, while other portions may be acquired using three-dimensional mapping of an eye impression. The point clouds can be combined to generate a single point cloud with larger coverage and/or smaller uncertainties.

In some embodiments, it may be beneficial to perform a sparse sampling of the direct eye surface measurement and/or the impression to generate a set of three-dimensional points describing the eye surface. The eye surface point cloud may be generated later using a mathematical algorithm that interpolates the surface of the lens between the sparse point sampling. The sparse sampling may be specified by a pre-defined grid, or it may be generated for a specific eye based on various surface features and anatomies. In certain embodiments, a plurality of extreme points on the eye surface may be identified and the remainder of the eye surface may be interpolated between these points.

In some embodiments, points can be added to the acquired three-dimensional points wherein the newly added points represent an interpolation or extrapolation of the pre-existing three-dimensional points. For example, where the three-dimensional points include gaps, additional points can be added by interpolating between existing points. Similarly, where the three-dimensional points do not extend to provide desired coverage, additional points can be added by extrapolating past existing points. In some embodiments, points can be added to the three-dimensional points specifying the eye surface wherein the newly added points represent a mathematical modeling of a shape of the eye based on biomechanical properties of the eye.

In some instances, the shape of the sclera may not be cylindrically symmetric and may be represented by steep and shallow regions. In such instances, obtaining a dense point cloud of the eye may not be necessary to construct a contact lens. It may be beneficial to determine the orientations of extreme meridians and define the shape of the haptic surface by interpolation of the sagittal height curve as a function of the angle for each of the radii. A haptic surface defined in such manner may be a generalization of a quadrant-specific lens design, where the locations of extreme meridians are not necessarily at right angles relative to one another. In some implementations, more than one meridian may be used for defining the haptic surface of the lens. The locations of the meridians and the shape of the lens along these meridians may be determined from the topographic measurement of the eye, by evaluating a lens fit, or by any other suitable method.

In labelling the acquired points, as in block 110 of the method 100, additional information can be used to generate useful labels. This additional information can be included, for example, as the other inputs 112 of the method 100. Examples of types of additional information are provided herein that can be used as the other inputs 112 of the method 100. These examples include, but are not limited to, images, pupil measurements, conjunctival thickness, optical properties of the eye (e.g., optical path differences), eyelid images and associated parameters, aberrometry, anterior and posterior corneal power, lenticular power, gaze direction, angle kappa, angle alpha, visual axis orientation and location, fixation point, and the like.

In addition to measuring corneal and/or scleral topography, it may be beneficial to image the anterior surface of the eye. Various imaging techniques may be used to acquire the image of the anterior surface of the eye. The image may be a color image, black and white image, monochromatic image, an infrared image, fluoresce image, en-face OCT image, or any other type of image that may show various eye anatomies or pathologies.

Images of the eye can be used in block 112 of the method 100 to improve or enhance labelling the acquired points in block 110. In some embodiments, the point cloud originating from the direct measurement of the eye surface or measurement of the eye impression can be combined with an image of the eye. In such embodiments, it may be advantageous to determine a correspondence between the acquired points of the eye (e.g., the topographic map of the eye) and the acquired images of the eye surface. Different points in the point cloud may be labeled with corresponding anatomical features of the eye obtained from analysis of the eye image. This may be done through user input or by using an automated software algorithm. For example, the image of the anterior eye surface may be used to determine the horizontal visible iris diameter (HVID) and/or to identify anatomies including, but not limited to, the limbus, pupil, and blood vessels.

A particular imaging technique includes anterior segment imaging. Anterior segment imaging may be used for characterizing and documenting various pathologies on the eye surface that may influence the design of the specialty contact lens for a particular patient.

Another example of additional information that can be used in block 112 of the method 100 includes measurements of the pupil. In some embodiments, it may be advantageous to measure the pupil in various illumination conditions to understand the location of the pupil and the range of the pupil size. The pupil size measurements can be used to define parameters of multifocal optics or aspherical optics. The sizes and other parameters of different zones of the lens can be specified as percentages of the sizes of photopic and scotopic pupil. The sizes and other parameters of different zones of the lens can be based on a formula that takes into consideration both of these measurements.

Another example of additional information that can be used in block 112 of the method 100 includes measurements of the conjunctival thickness. Measuring the conjunctival thickness may be beneficial for designing a contact lens with an acceptable or desirable fit. This may be particularly applicable for certain types of lenses. Measuring the conjunctival thickness can be performed using OCT or any other suitable method, such as the methods disclosed herein. In some implementations, a fluorescent solution may be applied to the eye and a certain pattern or a sequence of patterns may be projected onto the eye in one or more wavelengths that excites the fluorescent solution and in one or more wavelengths that do not excite the fluorescent solution. By comparing the measurements performed using the different wavelengths, the conjunctival thickness can be measured. The projected patterns may be applied simultaneously or sequentially.

Another example of additional information that can be used in block 112 of the method 100 includes optical properties of the eye. It may be beneficial to assess optical properties of the eye using one or several measurements. Such measurements may include subjective or objective refraction, wavefront aberrometry, optical path difference measurement, raytracing, higher order aberrations measurements, corneal power, internal power, lenticular power, posterior corneal power, gaze direction, angle kappa, angle alpha, pupil size, visual axis orientation and location, fixation point, and the like. It may also be beneficial to evaluate the patient's binocular vision using phoria, vergence, or other measurements of the binocular visual function.

In certain implementations, optical path difference measurements may be used instead of, or in addition to, wavefront measurements. Optical path differences may be represented by Zernike polynomials, for example. However, it is to be understood that other functions known to a person of ordinary skill in the art can also be used to represent optical aberrations or optical pathlengths.

By way of example, an ocular examination can include a measurement of optical path differences of the internal optics of the eye. Subsequent lens design may be geared towards compensation of the optical path differences. As another example, a first lens with known optic zone parameters may be fabricated and placed onto the eye. The optical path differences may then be measured with the lens on the eye and a second lens may be manufactured with a modified front surface designed to compensate for measured optical path differences.

Another example of additional information that can be used in block 112 of the method 100 includes images of the eyelid along and parameters derived from these images. It may be advantageous to image the eyelid opening and to quantify a number of parameters. These parameters include, but are not limited to, vertical and horizontal opening of the eye and the overall shape of the ocular surface. In some cases, such measurements may be used to design a non-round lens. An example of such a contact lens is a lens that is elongated in one direction.

Another example of additional information that can be used in block 112 of the method 100 includes the addition of one or more features to the contact lens. For example, in defining a contact lens shape, it may be advantageous to have the possibility of adding features including but not limited to custom cutouts, channels, lifts etc. The properties of such adjustments may be determined from the anterior surface topography, anterior surface imaging, or other considerations.

In some embodiments, it may be beneficial to consider the implications of an improperly disposed lens when designing a contact lens. For instance, if the back surface of the lens is designed to follow the shape of the eye, it may be beneficial to model the situation in which the lens is improperly rotated during insertion. It may be beneficial to design a lens in such a way that improper insertion will not cause discomfort or injury to the patient. These considerations can be used as the other inputs in block 112 of the method 100 and/or as specific constraints in block 114 (or block 135) of the method 100.

In block 110, the contact lens design system is configured to label some or all of the acquired points of the eye. The labels can be assigned based on the anatomy, physiology, pathology, or some other property of the points and can utilize the other inputs in block 112, examples of which are described herein. For example, labels can be defined such as "cornea," "sclera," "blood vessel," "aqueous vein," "limbus," "limbus region between 3 o'clock and 6 o'clock angles," "pinguecula," "bleb," "corneal transplant," and others. To a person skilled in the art, it may be apparent that a variety of labels describing various anatomies and pathologies may be used. In some cases, a single point in the eye surface may have more than one label or no label at all. In some implementations, the eyecare practitioner or contact lens manufacturer may define their own set of labels, which may or may not correspond to known anatomies, pathologies, or aspects of the eye.

In block 114 (and in block 135), the contact lens design system identifies and applies constraints to influence the mathematical representation of one or both surfaces of the contact lens. The set of constraints can be configured to describe the relationship between the eye surface and one or both surfaces of the lens. Constraints may be defined as hard constraints or they may be defined as soft constraints (e.g., by providing a range of acceptable values and defining the lens parameters in such a way that the measured quantity lies within the defined constraint range). The constraints may also be presented to reduce or minimize a certain physical or geometric value. The contact lens design system can be configured to specify constraints on transitions between adjacent portions of the lens. These constraints may include smooth transitions, radii of curvature at the interface, transition region size, ranges of angles between two adjacent sections, etc. In some implementations, more than one constraint may be imposed on a certain portion of the lens. Examples of constraints include distances, clearances, settling depths, angles, compressions, oxygen permeability, centration of the lens on the eye, gas and fluid exchange, other physical or physiological parameters, and/or constraints related to bulk properties of the lens such as the lens thickness, material properties, oxygen permeability, optical properties, refractive index, and others.

Any of the disclosed constraints can be applied in block 114 to influence an initial mathematical representation and/or in block 135 to influence adjustments to the mathematical representation. In some embodiments, the contact lens design system can use the assigned labels to identify and/or to generate constraints in block 114 and/or in block 135.

In some embodiments, the contact lens design system can provide a uniform set of constraints for all points with the same label. In certain embodiments, a single point or a plurality of points can be selected and one or a few constraints can be generated specifically for these selected points. In various instances, it may be beneficial to define certain sectors of the lens and to provide separate constraints for these sectors. Such sectors may be represented by arbitrary angles which may or may not be tied to the eye's surface measurements or anatomy.

An example of a constraint that can be applied includes a measurement or an evaluation of the centration of the lens on the eye. The centration of the lens can be used to position features on the designed lens that correct for optical path differences. Such measurements may be performed by placing singular or plural markings on the lens and imaging the location of the markings with respect to features on the eye, such as the pupil, visible iris, or visual axis. Another method of measuring the lens centration may be implemented by placing a lens of a known shape on the eye and using topographic measurements of the lens in combination with the imaging to evaluate the centration of the lens on the eye. The measurement may be performed using a single imaging sensor or multiple sensors that can provide triangulation capability in the measurement.

Another example of a constraint that can be applied includes ensuring sufficient gas and fluid exchange between the ocular surface and the environment. In some aspects of contact lens fitting, it may be advantageous to ensure that the ocular surface is properly oxygenated. The oxygenation of the ocular surface may depend on several parameters including the oxygen permeability of the lens material as well as the lens thickness and the clearance between the lens and the surface of the eye.

As an example, it may be desirable to design a lens that has the ability to transmit oxygen to different portions of the eye. The oxygen transmission may depend on the lens thickness, distance between the back surface of the lens and the eye surface, and the Dk value of the material used to manufacture the lens. In general, the local oxygen permeability of a two-layer system can be defined as:

$$Dk/t = \frac{1}{t_1/Dk_1 + t_2/Dk_2}$$

where Dk and t values are the oxygen permeability and thickness of the respective layers.

The Dk/t value may be imposed as one of the constraints in determining the lens shape. In some instances, it is beneficial to increase or maximize Dk/t to provide sufficient oxygen to the surface of the eye. This may be achieved by reducing or minimizing the clearance between the back surface of the lens and the eye surface, reducing or minimizing the lens thickness, and/or selecting a lens material with high Dk values. However, the minimum thickness of the lens may be limited by the manufacturing process and material strength. Furthermore, the shape of the front surface of the lens may be determined by the optical performance requirements. As a particular example, materials used for scleral lens manufacturing typically have higher oxygen permeability than the solution filling the space between the lens and the eye. Thus, in such instances, it may be beneficial to vary the thickness of the lens to increase or maximize the oxygen transmission to the cornea while maintaining sufficient clearance between the back surface of the lens and the eye, as well as preserving the optical performance of the lens.

It may be beneficial to include an ocular surface oxygenation map for the practitioner or the lens manufacturer. For example, this map can be a color-coded two-dimensional or three-dimensional map of the eye surface or any other suitable format representing the oxygenation quantities. The ocular surface oxygenation map may also be an oxygen transmission report. This report can illustrate a simulated fit of a contact lens on the eye. The report can contain, for example, one or more of a visual representation of the oxygen transmission to the eye surface; numerical calculation of the oxygen transmission to various portions of the eye; numerical calculation of the average oxygen transmission to the eye; or numerical calculations of the maxima and minima of the oxygen transmission to the eye for various portions of the eye surface. Examples of oxygenation maps are described herein with respect to FIG. 5.

As set forth herein, a plurality of three-dimensional points representing the eye surface can be used as a starting point for designing a specialty contact lens. These eye surface points can be acquired using any suitable method, as described herein. The plurality of eye surface points can include a dense point cloud, a sparse set of points, or simply a few points representing the ocular surface. Starting from these eye surface points, a contact lens can be designed or generated by generating a contact lens point cloud that matches fully or partially the plurality of eye surface points. In such embodiments, modifications to the lens may be performed on a point by point basis. However, this may be a time-consuming process. Thus, in block 115, the contact lens design system is configured to approximate one or both surfaces of a contact lens with one or more mathematical constructs.

Relatedly, a contact lens point cloud that closely follows the plurality of eye surface points can become overly complex. Consequently, manufacturing of the custom lens on a lathe or other device may take too long. Thus, in block 115, the contact lens design system is configured to approximate one or both surfaces of a contact lens with one or more mathematical constructs. The approximations used to generate the lens shape design can be configured to enhance, improve, or optimize the lens manufacturing process. This can result in instruction files that are less complex, as described with respect to block 120 of the method 100.

In some embodiments, the lens can be separated into regions. In block 115, the contact lens design system can approximate the different regions with different sets of mathematical constructs.

The mathematical constructs used in block 115 can be analytical functions, for example. These functions may be represented as a series of orthogonal functions describing a surface. One example of such a series is a hypergeometric function series. Spherical harmonics, a special case of a hypergeometric function series, may be used to define a continuous surface with a desired degree of approximation to the surface. Other examples of mathematical constructs include, but are not limited to, polynomials, splines, trigonometric functions, and other mathematical functions that can be used for approximating or describing curves, surfaces, or shapes.

In certain implementations, the mathematical constructs may have a numerical representation or can be a mixture of analytical functions and numerical points. The functions specifying the lens surfaces can be selected to enhance or to optimize optical performance. The functions can be selected to conform to specified boundary conditions. The functions can be used to approximate the elastic and other biomechanical properties of the eye.

The mathematical constructs can be configured to provide suitable optical properties as well as fit for the resulting contact lenses. For example, the mathematical representation of the contact lens can be configured to provide targeted optical properties in an optic zone of the lens. The front surface of the contact lens corresponding to the pupil zone of the eye may be responsible for the optics of the eye. Thus, the portion of the lens nearest the pupil zone of the eye may be called the optic zone. The optic zone may be centered at the pupil center or the visual axis within the pupil. However, in some cases it may be convenient to align the optic zone with the center of the limbus. In general, the pupil zone may extend farther than the visible pupil of the eye.

In some cases, it may be convenient to describe the front surface nearest the pupil (e.g., the optic zone) using a sphere. In certain cases, it may be beneficial to generate aspheric surfaces to compensate for spherical aberrations or to provide optics with extended focus depth. In various cases, an astigmatic correction may be implemented in the front surface of the lens nearest to the pupil. In some cases, it may be beneficial to define the front surface of the lens using multifocal optics, where the pupil region is separated into several sections with distinct focal lengths. In various cases, it may be beneficial to describe the shape of the front surface of the lens over the pupil using Zernike polynomials including higher order polynomials that may be responsible for correcting higher order aberrations in the eye.

In some cases, it may be beneficial to decouple the front and back surfaces of the lens. For instance, the back surface may be designed in such way that it provides constant or near-constant clearance over the corneal surface, while the front surface of the lens is designed in such a way that it enhances or optimizes the lens optics and/or quality of vision.

Thus, the contact lens design system obtains a point cloud of the eye surface (in block 105) with one or few points appropriately labeled (in block 110), potentially utilizing additional information in block 112. The contact lens design system defines general lens parameters and defines a set of constraints (in block 114) between the lens and the eye. The contact lens design system generates an analytical or numerical representation of one or both surfaces of the contact lens (in block 115). This representation may later be used to generate the manufacturing file (in block 120) which can be transferred to a lens manufacturing apparatus or system which can then manufacture the lens. This process can be repeated as needed to achieve a desirable or acceptable specialty contact lens. Each iteration can add new points representing the eye, add or change constraints, and/or add or change labels.

Scleral Lens Examples

By way of example, a custom scleral lens may be manufactured. A scleral lens can be a contact lens made of rigid gas permeable material. The scleral lens is designed so that it is supported by the eye's sclera and vaults over the limbus and the cornea. The surfaces of the scleral lens are conventionally defined as: the back surface (the surface that is closest to the eye) and the front surface (the surface in contact with air).

In manufacturing a scleral lens, it may be convenient to separate the eye into sections with different functionalities. These sections may include, for example and without limitation, pupil, peripheral cornea, and sclera. The scleral portion of the eye may be separated further into sclera where the haptic of the lens may be located and outer points of the sclera which may not be covered by the lens.

The back surface of the lens over the sclera may be in contact with the sclera and may support the lens on the eye. It may be advantageous to align the back surface of the lens with the scleral topography. In many cases, lenses settle into the eye. It may be advantageous to include the lens settling as a separate constraint in the lens design or lens fitting or manufacturing software. The lens settling constraint may be identified and/or applied in block 114 of the method 100. This can be accomplished through a variety of methods including, but not limited to, normative data, specifics of the lens design, ocular surface conditions of the patient, age of the patient, and physiological measurements of eye, such as the conjunctival thickness. The constraints may also be updated in block 135 of the method 100 by performing an evaluation of the lens fit on the eye. Such evaluation may include, but not be limited to, evaluation of the central clearance, OCT imaging, Scheinpflug imaging, slit lamp microscopy, or any other suitable method used by a healthcare practitioner to evaluate a lens fit.

Figure 2:
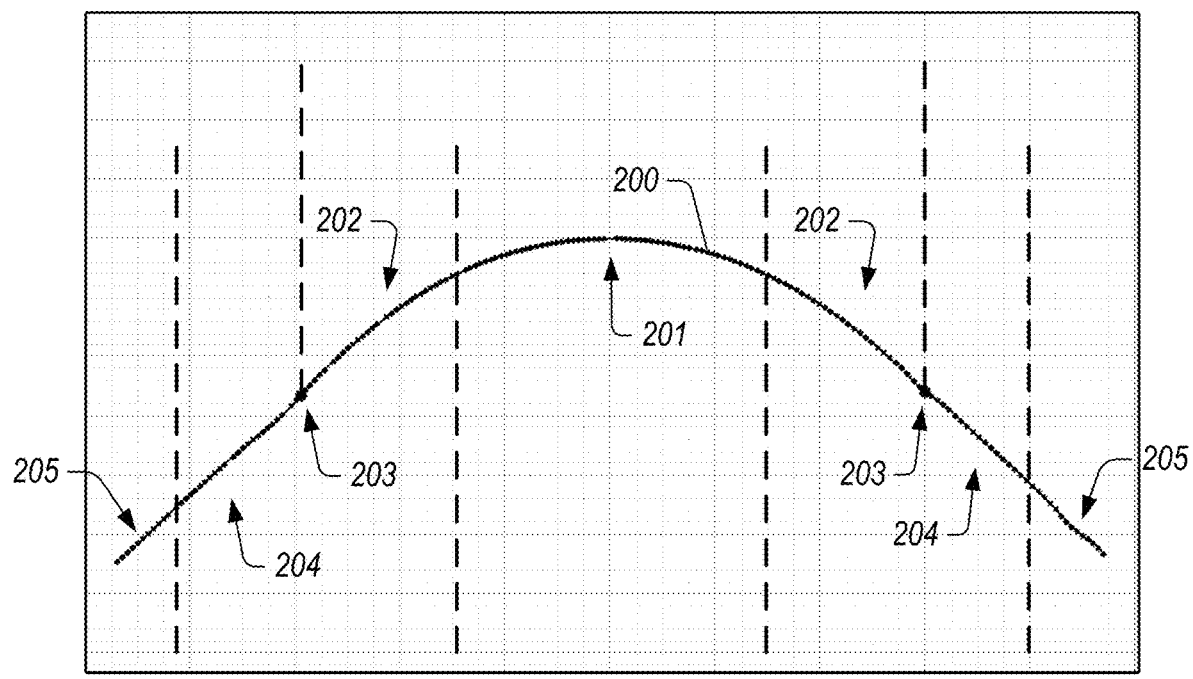
FIG. 2 illustrates a cross-section of an eye measurement with potential labels for different portions of the eye.

FIG. 2 illustrates a cross-section of an eye measurement with potential labels for different portions of the eye. The eye measurement comprises a point cloud 200 representing a surface of the eye. The point cloud 200 of the eye surface is labeled as follows: pupil 201, cornea regions 201, 202, limbus 203, sclera 204, and outer points 205. Note that the points labeled 201 are simultaneously associated with two labels: cornea and pupil.

Figure 3:
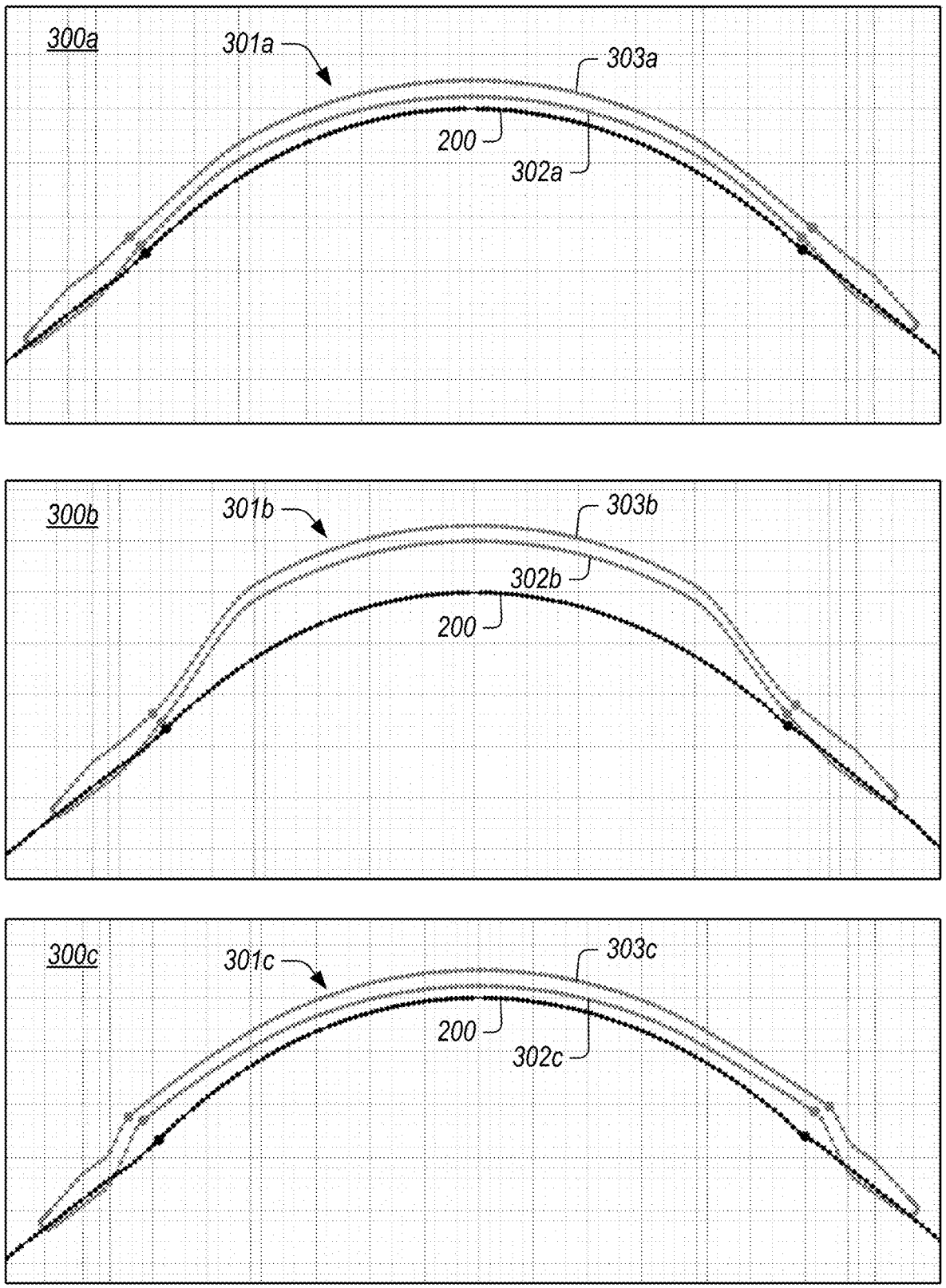
FIG. 3 illustrates examples of different scleral lens designs for the same eye and labels but with different constraints.

By way of example, a lens made for the eye illustrated in FIG. 2 can have the following constraints: (1) spherical back and front surfaces at the lens surfaces located nearest the cornea/pupil region 201; (2) pre-defined distance between the limbus region 203 and the nearest point on the lens at a normal direction to the eye surface; (3) the back surface of the lens is at a specified depth below the sclera region 204; (4) specified distance between the lens and the central point of pupil region 201; and (5) derivatives of the lens surface up to a certain order are continuous. FIG. 3 illustrates examples of different scleral lens designs for the same eye and labels but with different variations on these constraints.

FIG. 3 illustrates graphs 300*a*-300*c* of this exemplary lens design applied to the point cloud 200 of FIG. 2 using different constraints. In each graph 300*a*-300*c*, the contact lens 301*a*-301*c* has a back surface that is respectively labeled 302*a*-302*c* and a front surface that is respectively labeled 303*a*-303*c*. Graph 300*a* illustrates the profile of a sample lens 301*a* for the eye. Graph 300*b* shows the same lens definition but with the constraint specifying a larger distance between the central portion of the eye surface and the back surface 302*b* of the lens 301*b*. Graph 300*c* shows the lens definition in graph 300*a* with a new constraint specifying a larger distance between the limbus region 203 and the back surface 302c of the lens 301c. In both graphs 300b and 300c, the modified constraints do not influence several of the parameters specifying the shape of the lens 301a in graph 300a. For instance, the shape of the lens in region 204 is identical in the three lenses 301a-301c. The radius of curvature of the lens in region 201, which specifies the optical properties of the lens, is also identical in the exemplary designs of the lenses 301a-301c.

Figure 4:
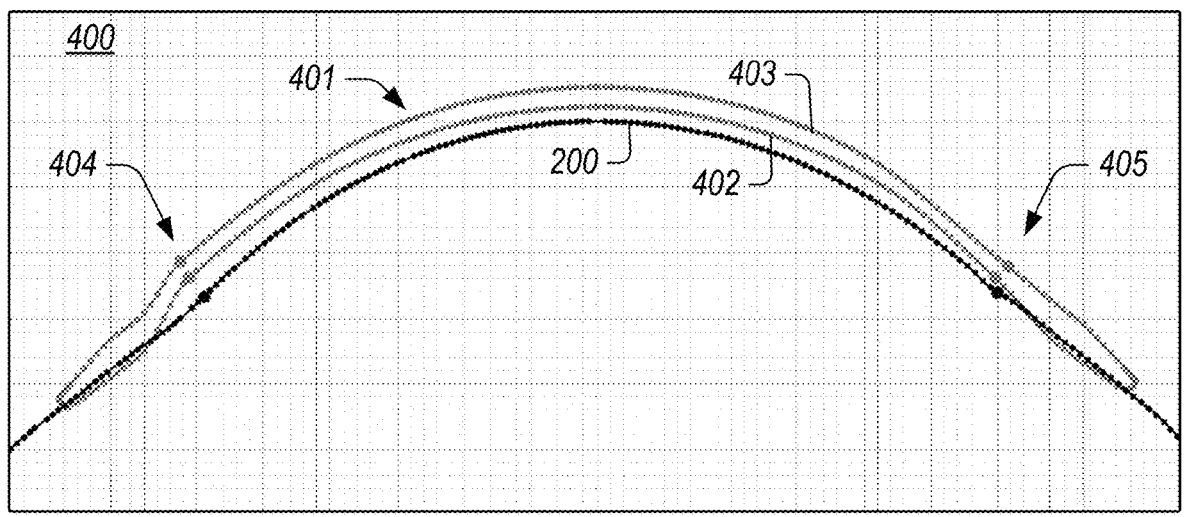
FIG. 4 illustrates an example of a scleral lens with different constraints applied to different points with the same label. The distance between the limbus and the back surface of the lens at one portion of the eye is larger than the same distance at another portion of the eye.

FIG. 4 illustrates an example of a scleral lens 401 with different constraints applied to different points with the same label. The point cloud 200 is from FIG. 2 and the scleral lens 401 has a back surface 402 and a front surface 403. The distance between the limbus 203 and the back surface 402 of the lens 401 at one portion of the eye labeled 404 is larger than the same distance at another portion of the eye labeled 405. This represents a lens 401 designed with different sets of constraints for different portions of a limbal zone of the eye. In such cases, it may be beneficial to split the limbus into several regions and provide separate constraints for various parts of the limbus. By way of example, it may be beneficial to separate the limbus points into Superior, Inferior, Temporal, and Nasal.

Figure 5:
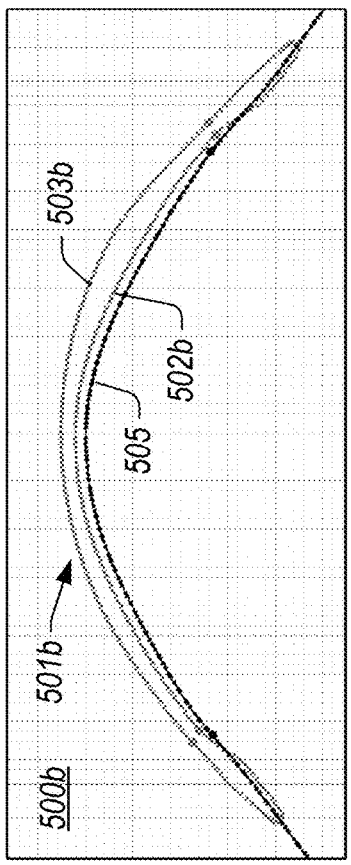
FIG. 5 illustrates two different lens designs and corresponding oxygen maps.
Figure 5:
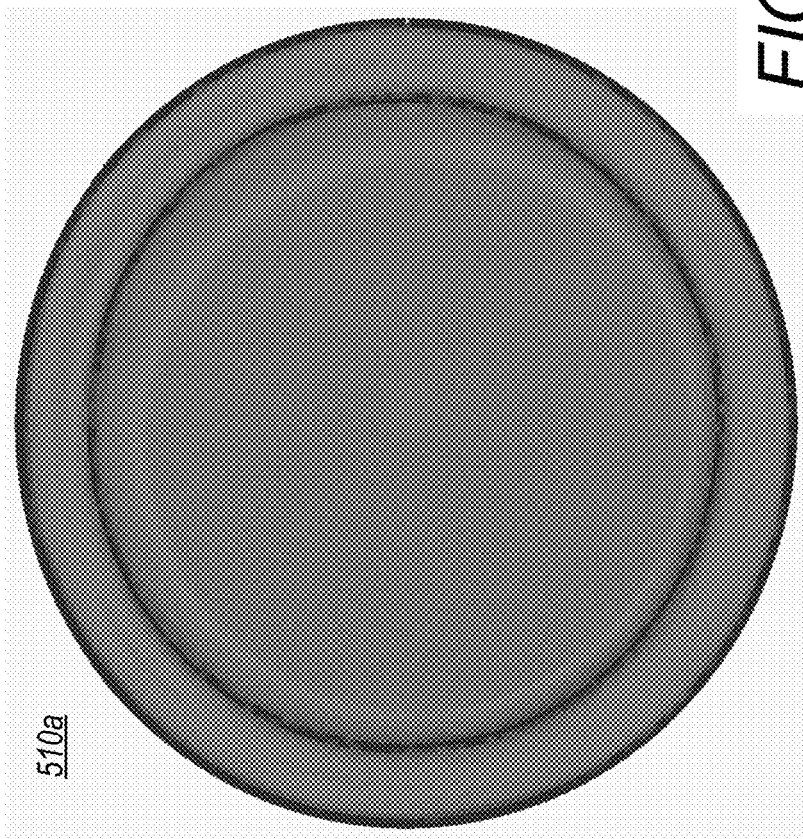

FIG. 5 illustrates two different lens designs and corresponding oxygen transmission maps. FIG. 5 demonstrates two designs of a lens fit on an eye 505 with an irregular cornea. The first lens 501a in graph 500a includes a back surface 502a and a front surface 503a designed for the eye point cloud 505. The second lens 502b in graph 500b includes a back surface 502b and a front surface 503b designed for the same eye point cloud 505.

In graph 500a, the lens 501a is defined with following constraints: (1) there is a minimal distance between the corneal apex and the back surface of the lens; (2) certain portions of the back and front surface of the lens are spherical with the same radius of curvature; and (3) a portion of the lens rests on the sclera. The localized oxygen transmission map of this lens is shown in graph 510a.

In graph 500b, the lens 501b is defined with the following constraints: (1) a front surface of the corneal portion of the lens is spherical; (2) the local oxygen transmissibility is maximized for all corneal and limbal regions; and (3) a portion of the lens rests on the sclera. Note that constraint (3) is the same for the lenses 501a, 501b. The localized oxygen transmission map of the lens in graph 500b is shown in graph 510b. Since the oxygen permeability of the lens material is higher than that of the saline solution, graph 500b shows increased thickness in certain portions of the lens 501b, which is a result of the attempt to maximize the oxygen transmission to the cornea while keeping a minimum clearance. The minimal clearance can depend on a preference of a healthcare practitioner, for example. The minimal clearance can be at least about 100 microns (about 0.004 inches) and/or less than or equal to about 200 microns (about 0.008 inches).

Oxygen transmission maps, such as graphs 510a, 510b, demonstrate the combined oxygen transmission of the lens and the tear film layer between the lens and the eye surface. Such oxygen transmission maps may be beneficial for designing a lens as well as for providing information exchange between the eyecare practitioner and patient. In some ocular health conditions, it may be beneficial to provide as much oxygen to the eye as possible. In such instances, the doctor and the patient may decide to select a lens with a more complex shape manufactured using a material with a higher Dk. The ability to evaluate oxygen permeability of the contact lens in combination with the tear film may be especially advantageous when a practitioner selects a high Dk material, but may not take into account the low oxygen permeability of the tear layer between the eye and the back surface of the lens. Being able to visualize the oxygen permeability map may guide the lens designer and the healthcare practitioner into selecting the proper combination of the lens material and design. In some cases, it may also be beneficial to calculate and display the average oxygen permeability over the portion of the eye surface. In other cases, it may be beneficial to calculate and display regions where oxygen permeability is the lowest. In other cases, it may be beneficial to outline regions where oxygen permeability is below a certain value. In other cases, it may be beneficial to display a color-coded map of oxygen permeability.

In some aspects of a scleral lens fit, the lens may influence the intraocular pressure (IOP). This may be a significant counterindication for scleral lens wearers with elevated eye pressure and glaucoma. One mechanism by which the scleral lens wear is thought to influence IOP is through compression of the episcleral veins and by influencing the aqueous humor outflow mechanism. It may be beneficial to design a scleral lens to specifically avoid compression of the blood vessels used to transport aqueous humor away from the anterior segment. For example, this can be done by imaging the anterior segment, identifying the location of aqueous veins and other blood vessels and modifying the shape of the lens to ensure that there is little or no compression on these sections of the eye. In some cases, imaging of the aqueous flow in conjunctival veins may be beneficial for evaluating the scleral lens design and/or fit.

Adjusting Mathematical Representations to Customize Fit

Once the scleral portion of the eye surface is identified and a set of constraints is established, it may become challenging to exactly solve the mathematical equations of the resulting boundary value problem. Various approximations may be used to simplify the calculations and to develop a representation of the front and back surface of the contact lens. For example, it may be beneficial to approximate one or both surfaces of the contact lens with a series of orthogonal functions. The shape of the eye is governed by its biomechanical properties and may be represented by a set of elastic equations describing an elastic shell filled with an incompressible liquid and having a set of forces applied to the surface where the extraocular muscles are connected. The deformations of such a surface may be described using spherical harmonics. It may be beneficial to also use spherical harmonics to approximate the shape of the scleral lens. The spherical harmonics create an orthogonal set of functions on the surface and, in general, any continuous shape may be described if series of sufficiently high orders are used.

One advantage in describing a portion of a contact lens using spherical harmonics or other orthogonal functions may be the ability to select the order of the series used. This enables a health practitioner or lens manufacturer to control the amount by which one or both surfaces of the contact lens are designed to repeat or mirror the surface of the eye. In some implementations, using higher orders of orthogonal functions allows for a surface of the contact lens to more closely approximate the topography of the eye and/or to more closely approximate a targeted lens surface topography. This can be done to improve fit on the eye and/or to improve optical performance for the patient. At the same time, the resulting approximation can be less complex than the actual surface topography of the eye. Consequently, the approximation can result in a good fit that is relatively easy to manufacture.

Figure 6:
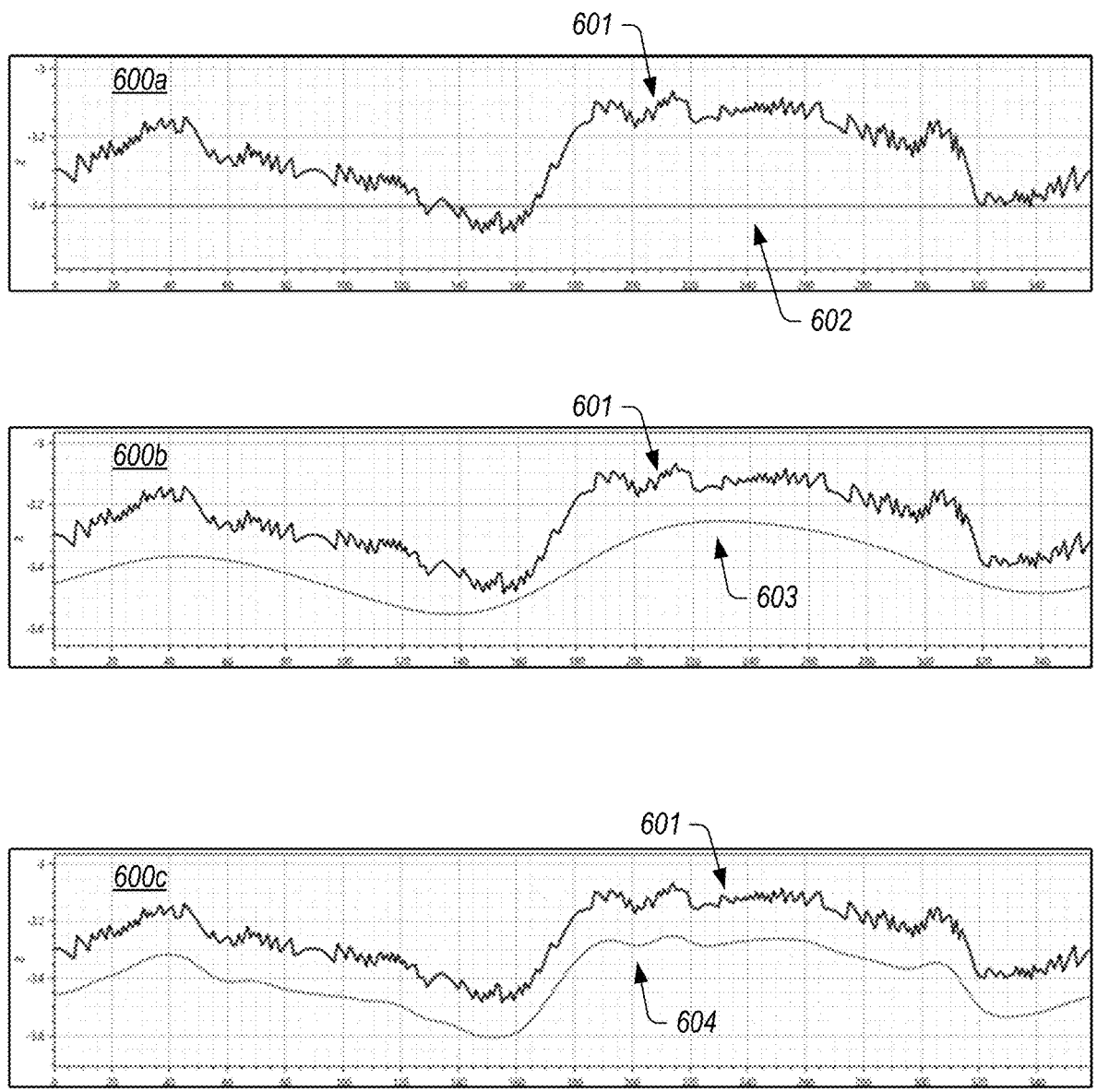
FIG. 6 illustrates various degrees of customization of the contact lens shape that depends on the order of the functions used for the approximation of the surface shape.

FIG. 6 illustrates various degrees of customization of a contact lens shape that depends on the order of the functions used to approximate the surface shape. Each of graphs 600a-600c illustrate a profile of the sagittal height of an eye 601 around a ring of a certain radius represented in cylindrical coordinates. Graph 600a illustrates the profile of a contact lens 602 around the ring of the certain radius also shown in cylindrical coordinates. The profile of the contact lens 602 is the result of using a zeroth-degree approximation, which is represented by a spherical function, resulting in a straight line in cylindrical coordinates.

Higher order functions allow the lens profile to have a closer match to the surface of the eye. For example, graph 600b illustrates the same profile of the eye 601 with a different profile for a contact lens 603, where higher order functions are used to generate the lens shape of the contact lens 603. The resulting profile of the contact lens 603 is a lens shape that more closely approximates the shape of the eye. As another example, graph 600c illustrates the same profile of the eye 601 with a different profile for a contact lens 604, where even higher order functions are used to generate the lens shape when compared to the lens shape of the contact lens 603 in graph 600b. For each plot 600a-600c in FIG. 6, the same eye point cloud is used as a starting point and the same labels are applied to various portions of the eye. However, the three lenses 602, 603, 604 have different shapes because of the differences in the order of the series of the fitting functions used. In some embodiments, the order of the function can be treated as a constraint in the process of deriving a mathematical representation of the lens surface(s).

Based on the complexity of the eye surface and the nature of the ocular surface condition, it may be beneficial for a healthcare practitioner to select the order of approximation of the lens shape. In some cases, it may be beneficial to use functions that are normally used to describe curves to define the shape of a contact lens. One such definition, which flows from the observation that the profile of the eye is continuous around a circle (e.g., as illustrated in FIG. 6), may be created by defining the average height profile for different eccentricities as one series of polynomial functions, while defining the sagittal height profile at a certain eccentricity as another series of polynomials. Due at least in part to the continuity constraint, it may be beneficial to select the second set of polynomials such that they are continuous and smooth around a unit circle. As an example, Chebyshev or Legendre polynomials may be used if properly scaled to be continuous around the circle. Alternatively, trigonometric functions or other functions may be used to represent the lens profile around a ring of a fixed radius.

In some embodiments, when a complex mathematical construct is used to define the lens shape it may not be sufficient to specify only the order of the functions used to define the lens surface(s). It may be beneficial to define a special value that represents the amount of the surface customization. The healthcare practitioner may be able to communicate this value to the lens designer (e.g., the contact lens design system) to describe the amount of customization needed for a certain specialty contact lens. The value may be an arbitrary number, for example between 0 and 100, with 0 representing a very symmetrical lens and 100 representing the lens that follows the eye surface shape exactly.

Contact Lens Design and Manufacturing Systems

A lens design and manufacturing system can be implemented using several components that include eye measurement instruments, lens design software, lens design parameters, lens manufacturing file generation software, and lens manufacturing systems. In addition, means of transferring data between these systems may be implemented. In some cases, the eye measurement instrumentation is located in one location (e.g., a health practitioner's office) and the lens design software and lens manufacturing system may be located in another location (e.g., at the lens manufacturer's office). In some instances, the healthcare practitioner may have the lens design software at their location. The data transfer between the systems may be accomplished using any suitable data sharing technology including wired or wireless transmission and/or the use of local or wide area networks. The data may be stored at the healthcare practitioner's location, at the manufacturer's location, at an offsite server, in the cloud, in the blockchain or in any other location. The lens manufacturing system may be designed to provide convenient access to the data to the parties required for lens design generation.

Figure 7:
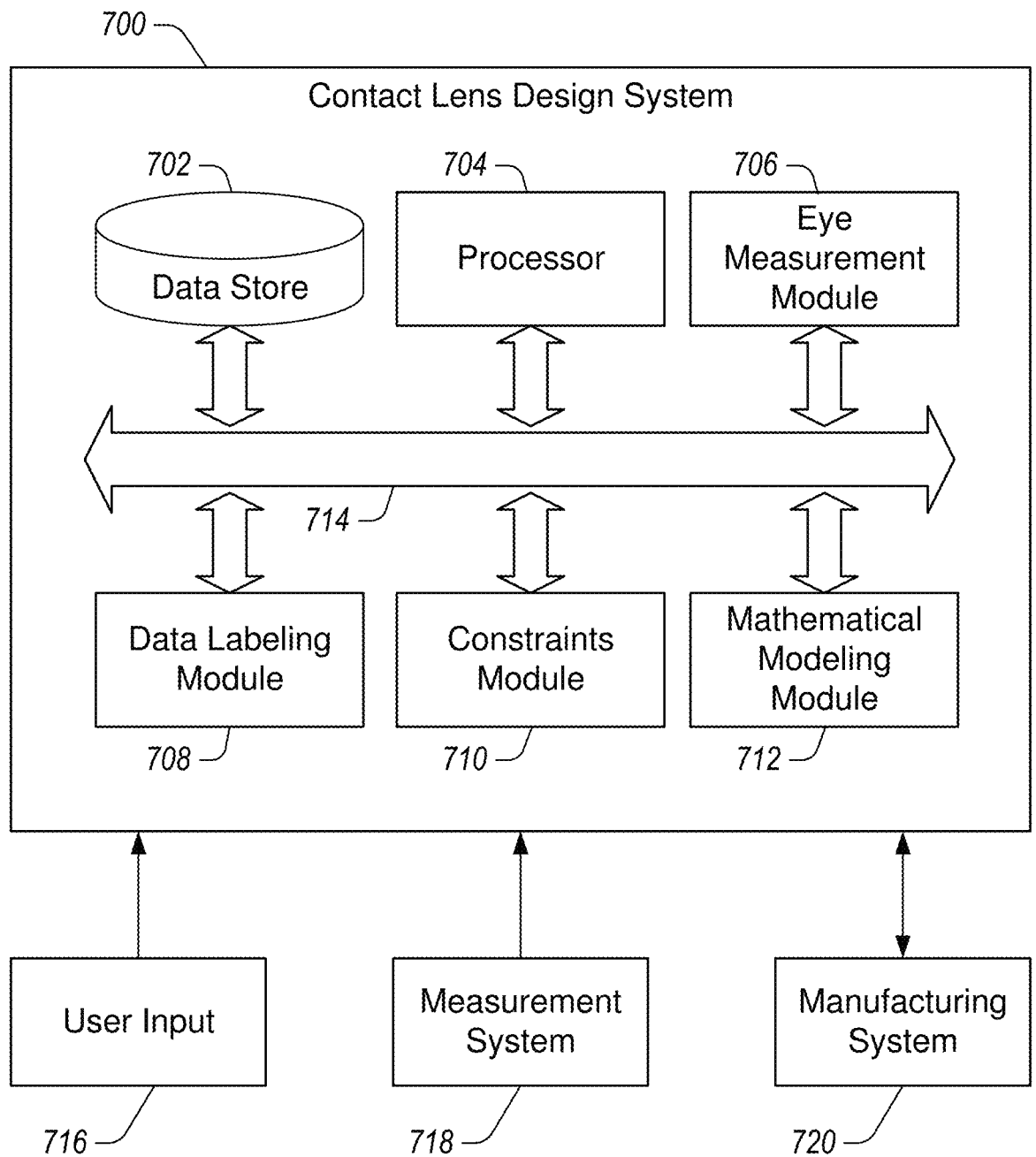
FIG. 7 illustrates a block diagram of an example contact lens design system configured to generate a specialty lens design based at least in part on eye topography of a patient.

FIG. 7 illustrates a block diagram of an example contact lens design system 700 configured to generate a specialty lens design based at least in part on eye topography of a patient. The contact lens design system 700 can employ any method described herein for designing contact lenses for manufacture, such as the example method 100 described herein with reference to FIG. 1.

The contact lens design system 700 can include hardware, software, and/or firmware components for designing contact lenses for manufacturing. The contact lens design system 700 is configured to acquire eye topography data, label eye topography data, identify and apply constraints, and generate designs for contact lenses using mathematical constructs. The contact lens design system 700 is also configured to supply a manufacturing system instruction files to manufacture designed contact lenses; to update eye measurements, labels, and/or constraints; and to adjust the design of the contact lens. The contact lens design system 700 can include a data store 702, one or more processors 704, an eye measurement module 706, a data labeling module 708, a constraints module 710, a mathematical modeling module 712. Components of the contact lens design system 700 can communicate with one another, with external systems, and with other components of a network using communication bus 714. Communication can occur using wired or wireless means and can utilize, for example, local area networks and/or wide area networks. The contact lens design system 700 can be implemented using one or more computing devices. For example, the contact lens design system 700 can be implemented using a single computing device, multiple computing devices, a distributed computing environment, or it can be located in a virtual device residing in a public or private computing cloud. In a distributed computing environment, one or more computing devices can be configured to provide the modules described herein to provide the described functionality.

The contact lens design system 700 includes the eye measurement module 706. The eye measurement module 706 is configured to acquire points representing a surface of the eye. The eye measurement module 706 can receive the data points from an external system (e.g., a measurement system 718) or from a database stored in the data store 702. The eye measurement module 706 can receive point cloud data and/or imaging data, as described herein. Thus, the eye measurement module 706 is configured to interface with measurement systems, imaging systems, data stores (local and remote), and the like to acquire and/or to receive data points representing the eye of a patient.

The contact lens design system 700 includes the data labeling module 708. The data labeling module 708 can be configured to assign labels to the points acquired by the eye measurement module 706. The data labeling module 708 can use data points representing ocular topography and/or imaging to determine labels for some or all of the points acquired by the eye measurement module 706. The data labeling module 708 can be automated and/or it can receive input to assign labels from a user input 716. The user input 716 can be any suitable mechanism for providing input to a system, such as a keyboard, mouse, touchscreen, mobile device, voice command, and the like. The data labeling module 708 can retrieve labels from the data store 702. The data labeling module 708 can receive labels from the user input 716, the measurement system 718, and/or the manufacturing system 720. The data labeling module 706 can utilize additional information other than data acquired by the eye measurement module 706 to determine labels for acquired data points. For example, the data labeling module 708 can utilize information described with respect to the other inputs in block 112 of the method 100 described herein with respect to FIG. 1.

The contact lens design system 700 includes the constraints module 710. The constraints module 710 can be configured to assign constraints to the points acquired by the eye measurement module 706 and/or labeled by the data labeling module 708. The constraints can be retrieved from the data store 702. The constraints can be received via the user input 716. The constraints can be automatically assigned and/or they can be manually assigned (e.g., using the user input 716). The constraints can be stored in the data store 702 along with the acquired points to define an instruction file for the manufacturing system 720. As described herein, the constraints module 710 can identify and apply constraints as described with respect to block 114 of the method 100 described herein with respect to FIG. 1.

The contact lens design system 700 includes the mathematical modeling module 712. The mathematical modeling module 712 is configured to generate one or both surfaces of a contact lens using mathematical constructs, as described herein. The mathematical modeling module 712 can be configured to use orthogonal functions to approximate an eye surface and/or to generate a lens surface. In some embodiments, the mathematical modeling module 712 is configured to receive a customization parameter that affects the degree to which the mathematical construct approximates a targeted surface (e.g., the eye topography). In some implementations, the customization parameter affects the order of the series of the orthogonal functions used to generate the surface. In certain implementations, the customization parameter is a factor (e.g., between 0 and 100 or between 0 and 1) that affects how closely the mathematical approximation approaches the targeted surface. The mathematical modeling module 712 can be configured to retrieve mathematical constructs from the data store 702 and/or to receive them from the user input 716. The mathematical modeling module 712 generates the approximation of the surface based on the points acquired by the eye measurement module 706, the labels assigned by the data labeling module 708, and the constraints imposed by the constraints module 710. The resulting mathematical representation can be used to generate an instruction file that is sent to the manufacturing system 720 to enable that system to manufacture the contact lens.

The contact lens design system 700 includes one or more processors 704 that are configured to control operation of the modules 706, 708, 710, 712 and the data store 702. The one or more processors 704 implement and utilize the software modules, hardware components, and/or firmware elements configured to generate contact lens designs. The one or more processors 704 can include any suitable computer processors, application-specific integrated circuits (ASICs), field programmable gate array (FPGAs), or other suitable microprocessors. The one or more processors 704 can include other computing components configured to interface with the various modules and data stores of the contact lens design system 700.

The contact lens design system 700 includes the data store 702 configured to store eye measurement data, labels, constraints, instruction files, algorithms, executable instructions (e.g., instructions for the one or more processors 704), and the like. The data store 702 can be any suitable data storage device or combination of devices that include, for example and without limitation, random access memory, read-only memory, solid-state disks, hard drives, flash drives, bubble memory, and the like.

In addition to providing the healthcare practitioner and lens manufacturer with automated lens designs, it may be beneficial to provide them with additional capabilities to modify the shape of the lens and to adjust various constraints defining the contact lens shape. These capabilities may include standard computer aided design (CAD) software design tools such as capabilities to modify back or front surface of the lens along any meridian by providing a capability to grab and drag a point of the lens along a specific meridian; as well as creating voids, lifts, channels, and other features. These design adjustments or modifications can be sent to the contact lens design system 700 through the user input 716.

In certain implementations, a healthcare practitioner may measure the eye surface and upload the measurement via an electronic portal along with any additional information, such as image of the patient's eye, OCT images, prescription, over refraction, medical condition, and others. The contact lens design system 700 can be configured to receive the data and the supplemental information and may generate one or several lens designs. The lens designs may vary by the means of labeling the eye data, applying different constraints, or selecting the degree of customization (fit factor). In general, several lens designs based on different constraints and fit factors may be defined and stored in the data store 702 of the contact lens design system 700. Once the lens designs are prepared, the contact lens design system 700 may make the designs available to the eyecare practitioner through the electronic portal. The eyecare practitioner may be able to select one or several lenses to be manufactured or propose changes to one or several of the lenses. Several design iterations may be accomplished so that both the manufacturer and the eyecare practitioner agree on the lens design, upon which a lens may be manufactured and sent out. Once the lens is tried on the eye, some adjustments may be needed, which may be communicated to the contact lens design system 700 through the same electronic portal or by other means of communication.

Additional Embodiments and Terminology

The following is a list of numbered embodiments that provide examples of implementations of the subject matter presented herein. The numbered embodiments can be combined in any suitable fashion to arrive at a variety of unique implementations. Furthermore, the numbered embodiments are not intended to limit the scope of the disclosure but rather to provide examples of potential implementations.

1. A method of designing a contact lens, comprising: acquiring a plurality of three-dimensional points representing the eye surface; labeling one or more of the points with one or more labels; identifying a set of constraints that relate one or two surfaces of the contact lens to the labeled points representing the eye surface; generating one or both contact lens surfaces based on the set of defined lens parameters and said constraints.

2. The method of embodiment 1, wherein the three-dimensional points are acquired using one or more of the following methods: Placido topography, Scheimpflug imaging, optical coherence tomography, impression, structured light scanning, profilometry, or slit light scanning.

3. The method of any of embodiments 1-2, wherein an image of the eye is acquired, and the points are labeled by automatically or manually cross-referencing between the three-dimensional points and corresponding portions of the acquired image.

4. The method of any of embodiments 1-3, wherein the one or both lens surfaces are approximated using series of mathematical or numerical functions.

5. The method of any of embodiments 1-4, wherein the one or both lens surfaces are partitioned into several sections and each of the sections has its own mathematical definition.

6. The method of any of embodiments 1-5, wherein the constraints are defined in terms of distances between labeled parts of the eye and sections of the one or both lens surfaces.

7. The method of any of embodiments 1-6, wherein the contact lens is a scleral contact lens.

8. The method of any of embodiments 1-7, wherein the contact lens is an orthokeratology device.

9. The method of any of embodiments 1-8, wherein the constraints are defined based on optimizing the vision of the person wearing the lens either during lens wear or after the lens removal.

10. The method of claim 9, wherein phoria measurements of one or both eyes are used to determine the alignment and shape of the at least portion of the front surface of the lens.

11. The method of any of embodiments 1-10, wherein a subset of the three-dimensional plurality of points is obtained through the measurement, and another subset is obtained through interpolation or extrapolation of the existing points.

12. The method of any of embodiments 1-11, wherein a subset of the three-dimensional plurality of points is obtained through the measurement, and another subset is obtained through mathematical modeling of the eye shape based on the biomechanical properties of the eye.

13. The method of any of embodiments 1-12, wherein the one or both surfaces of the contact lens are defined using a parameter or set of parameters that represent how accurately one or both surfaces of the lens should be constrained by the constraints.

14. The method of any of embodiments 1-13, wherein the constraints are defined based on optimizing a certain physical parameter describing the interaction between the eye surface and the contact lens.

15. The method of claim 14, wherein the parameter is the pressure excreted on the eye by the lens.

16. The method of any of embodiments 14-15, wherein the parameter is the oxygen transmission to the eye surface.

17. The method of claim 16, wherein the lens has a non-uniform thickness at the portion of the lens located adjacent to the cornea.

18. The method of any of embodiments 14-17, wherein the parameter is the compression of specific features on the eye surface.

19. The method of claim 18, wherein the feature is one or several of the aqueous veins in the eye 20. A report showcasing the simulated fit of a contact lens on the eye, said report containing one or several of the: a visual representation of the oxygen transmission to the eye surface; numerical calculation of the oxygen transmission to various portions of the eye; numerical calculation of the average oxygen transmission to the eye; numerical calculations of the maxima and minima of the oxygen transmission to the eye for various portions of the eye surface.

21. A method of designing a contact lens, comprising: acquiring a plurality of three-dimensional points representing the eye surface; labeling one or more of the points with one or more labels; identifying a set of constraints that relate one or two surfaces of the contact lens to the labeled points representing the eye surface; generating one or both contact lens surfaces based on the set of defined lens parameters and said constraints; manufacturing a lens based on the generated surfaces; identifying modifications that are needed to be made in order to provide a better fit; modifying the lens by one or both of the adjusting original constraints or relabeling the points on the eye surface.

22. The method of embodiment 21, wherein a set of constraints may be saved in a file or a database and a contact lens design may be defined as a set of constraints.

23. The method of any of embodiments 21-22, wherein the lens modifications may be made by adding one or more three-dimensional points to the plurality of points and defining labels and constraints to the newly added points.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of generating a manufacturing instruction file for the manufacture of a specialty contact lens, the method comprising:

acquiring three-dimensional points representing a surface of an eye;

automatically assigning two or more labels to at least some of the acquired three-dimensional points, the two or more labels representing scleral pathologies;

assigning geometrical distance constraints between at least some of the acquired three-dimensional points and at least one surface of the specialty contact lens, the geometrical distance constraints dependent on the assigned labels; and automatically generating a three-dimensional numerical representation of at least one surface of the specialty contact lens, wherein at least some of the acquired three-dimensional points in the three-dimensional numerical representation of the at least one surface of the specialty contact lens conform to the geometrical distance constraints applied between the at least some of the acquired three-dimensional points and at least some points on the at least one surface of the specialty contact lens; and acquiring an image of the surface of the eye and applying the geometrical distance constraints based on an analysis of the acquired image.

2. The method of claim 1, wherein the at least one surface of the specialty contact lens is represented with a series of orthogonal functions.

3. The method of claim 1, wherein labelling the acquired points is based at least in part on cross-referencing the acquired image of the surface of the eye with corresponding points of the acquired three-dimensional points.

4. The method of claim 1, wherein the three-dimensional points are acquired using one or more of the following methods: structured light scanning, profilometry, or slit light scanning.

5. The method of claim 1 further comprising partitioning one or both surfaces of the specialty contact lens into a plurality of sections with each section having a specific mathematical representation.

6. The method of claim 1, wherein the contact lens is a scleral contact lens.

7. The method of claim 1, wherein the constraints are defined based on optimizing the vision of the person wearing the lens after the lens removal.

8. The method of claim 7, wherein an assessment of phoria is used to determine the alignment and shape of the at least portion of the front surface of the lens.

9. The method of claim 1, wherein a subset of the three-dimensional points represents a measurement of the surface of the eye, and another subset represents an interpolation or extrapolation of the three-dimensional points.

10. The method of claim 1, wherein a subset of the three-dimensional points represents a measurement of the surface of the eye, and another subset represents a mathematical modeling of a shape of the eye based on biomechanical properties of the sclera.

11. The method of claim 1 further comprising applying additional constraints between the three-dimensional numerical representation and a numerical representation of the surface of the eye, the additional constraints representing an angle between a visual axis of the eye and an optical axis of the specialty contact lens.

12. The method of claim 11 further comprising modifying the lens by adjusting the applied constraints or assigning new labels to some or all of the acquired three-dimensional points, wherein modifications to the lens include adding one or more three-dimensional points to the acquired three-dimensional points and assigning labels and constraints to the newly added three-dimensional points.

13. The method of claim 1 further comprising applying additional constraints between a numerical representation of the surface of the eye and the three-dimensional numerical representation of the at least one surface of the specialty contact lens, the additional constraints representing a distance between a center of the limbus of the eye and an optical zone of the specialty contact lens.

14. A method of generating a manufacturing instruction file for the manufacture of a specialty contact lens, the method comprising:

acquiring three-dimensional points representing a surface of an eye;

automatically assigning two or more labels to at least some of the acquired three-dimensional points, the two or more labels representing scleral pathologies;

assigning geometrical distance constraints between at least some of the acquired three-dimensional points and at least one surface of the specialty contact lens, the geometrical distance constraints dependent on the assigned labels; and automatically generating a three-dimensional numerical representation of at least one surface of the specialty contact lens, wherein at least some of the acquired three-dimensional points in the three-dimensional numerical representation of the at least one surface of the specialty contact lens conform to the geometrical distance constraints applied between the at least some of the acquired three-dimensional points and at least some points on the at least one surface of the specialty contact lens, wherein the at least one surface of the specialty contact lens is represented with a series of orthogonal functions, wherein generating the numerical representation is limited by a degree of customization that depends on the order of the orthogonal functions used to generate the three-dimensional numerical representation of the shape of the at least one surface of the specialty contact lens.

15. The method of claim 14 further comprising partitioning one or both surfaces of the specialty contact lens into a plurality of sections with each section having a specific mathematical representation.

16. The method of claim 14, wherein the contact lens is a scleral contact lens.

17. The method of claim 14, wherein a subset of the three-dimensional points represents a measurement of the surface of the eye, and another subset represents an interpolation or extrapolation of the three-dimensional points.

18. The method of claim 14, wherein a subset of the three-dimensional points represents a measurement of the surface of the eye, and another subset represents a mathematical modeling of a shape of the eye based on biomechanical properties of the sclera.

19. A method of generating a manufacturing instruction file for the manufacture of a specialty contact lens, the method comprising:

acquiring three-dimensional points representing a surface of an eye;

automatically assigning two or more labels to at least some of the acquired three-dimensional points, the two or more labels representing scleral pathologies;

assigning geometrical distance constraints between at least some of the acquired three-dimensional points and at least one surface of the specialty contact lens, the geometrical distance constraints dependent on the assigned labels;

automatically generating a three-dimensional numerical representation of at least one surface of the specialty contact lens, wherein at least some of the acquired three-dimensional points in the three-dimensional numerical representation of the at least one surface of the specialty contact lens conform to the geometrical distance constraints applied between the at least some of the acquired three-dimensional points and at least some points on the at least one surface of the specialty contact lens; and receiving a customization factor representing a measure of an amount of customization required for the specialty contact lens, wherein the at least one surface of the specialty contact lens is represented with a series of orthogonal functions, wherein an order of the series of orthogonal functions is limited by the customization factor.

20. The method of claim 19 further comprising applying additional constraints between the three-dimensional numerical representation and a numerical representation of the surface of the eye, the additional constraints representing an angle between a visual axis of the eye and an optical axis of the specialty contact lens.

* * * * *